United States Patent [19]

Kunitomo et al.

[11] Patent Number: 5,436,503

[45] Date of Patent: Jul. 25, 1995

[54] SEMICONDUCTOR DEVICE AND METHOD OF MANUFACTURING THE SAME

[75] Inventors: Yoshinobu Kunitomo; Makoto Nozu, both of Kyoto; Yasuyuki Sakashita, Shiga; Masahide Tsukamoto, Nara; Seiichi Nakatani, Osaka; Keiji Saeki, Hyogo; Yoshifumi Kitayama, Osaka, all of Japan

[73] Assignee: Matsushita Electronics Corporation, Osaka, Japan

[21] Appl. No.: 153,108

[22] Filed: Nov. 17, 1993

[30] Foreign Application Priority Data

Nov. 18, 1992 [JP] Japan ................. 4-308589

[51] Int. Cl.⁶ ................. H01L 23/48; H01L 29/46; H01L 29/63; H01L 29/64
[52] U.S. Cl. ................. 257/737; 257/781
[58] Field of Search ............ 257/779, 780, 781, 782, 257/783, 786, 789, 795, 737, 738

[56] References Cited

U.S. PATENT DOCUMENTS

| | | | |
|---|---|---|---|
| 4,604,644 | 8/1986 | Beckham et al. | 257/779 |
| 4,970,575 | 11/1990 | Soga et al. | 257/786 |
| 5,001,542 | 3/1991 | Tsukagashi et al. | 257/783 |
| 5,128,746 | 7/1992 | Pennisi et al. | 257/780 |
| 5,136,365 | 8/1992 | Pennisi et al. | 257/783 |
| 5,194,930 | 3/1993 | Papathomas et al. | 257/779 |

FOREIGN PATENT DOCUMENTS 62-136865  6/1987  Japan .
63-313846  12/1988  Japan .

*Primary Examiner*—Sara W. Crane
*Assistant Examiner*—S. V. Clark
*Attorney, Agent, or Firm*—Willian Brinks Hofer Gilson & Lione

[57] ABSTRACT

The top surface of an insulating substrate is formed with a plurality of electrodes for bump connection, while the undersurface of the insulating substrate is formed with external terminals which are arranged in an array. On the insulating substrate is provided a semiconductor chip. The undersurface of the semiconductor chip is formed with bump electrodes. The electrodes for bump connection are electrically connected to the bump electrodes by means of a conductive adhesive. The space between the semiconductor chip and the insulating substrate is filled with a resin which integrates the above two and dissipates heat generated from the semiconductor chip.

2 Claims, 5 Drawing Sheets

SEMICONDUCTOR DEVICE AND METHOD OF MANUFACTURING THE SAME

BACKGROUND

The present invention relates to a semiconductor device which surely protects the integrated circuit of its semiconductor chip, provides a stable electrical connection between its external system and semiconductor chip, and realizes denser mounting of the semiconductor chip on its substrate, and it also relates to a method of manufacturing the same. With the semiconductor device of the present invention, the miniaturization of data communication equipment, office electronic equipment, home electronic appliances, industrial electronic equipment such as a measuring apparatus and assembly robot, medical electronic equipment, and electronic toys will easily be realized.

Below, a conventional semiconductor device will be described with reference to the drawings.

FIG. 11 shows the cross-sectional structure of the semiconductor device which is called a quad flat package (QFP). In the conventional semiconductor device shown in FIG. 11, its external terminals are provided on the side faces of the semiconductor package.

In a concave portion 3 of the semiconductor package 2, which serves as an insulating substrate composed of ceramic, is mounted a semiconductor chip 1 with electrodes (not shown) formed on its top surface. Around the concave portion 3 is formed a wire-bonding area 4 in which electrodes 5 are provided so as to correspond to the electrodes formed on the semiconductor chip 1. The electrodes 5 on the wire-bonding area 4 and the electrodes formed on the semiconductor chip 1 are connected by thin wires of Au or other material. To provide electrical connections between the electrodes 5 in the wire-bonding area 4 and an external system, external terminals 7 are formed on the sides of the semiconductor package 2. To protect the semiconductor chip 1 and thin wires 6, a lid 8 is attached to the semiconductor package 2.

Next, a method of manufacturing the conventional semiconductor device will be described with reference to the drawings. FIGS. 12 to 14 are cross sections which illustrate the process steps of manufacturing the conventional semiconductor device according to the method.

The method of manufacturing the conventional semiconductor device consists of a dice-bonding process, wire-bonding process, and sealing process.

First, the dice-bonding process will be described with reference to FIG. 12. In this process, the semiconductor chip 1 is mounted in the semiconductor package 2 by bonding the semiconductor chip 1 to the concave portion 3 of the semiconductor package 2 with the use of a conductive adhesive. The process is performed by using an apparatus called dice bonder.

Next, the wire-bonding process will be described with reference to FIG. 13. To provide electrical connections between the electrodes of the semiconductor chip 1 mounted in the semiconductor package 2 and the electrodes 5 provided in the wire-bonding area 4 of the semiconductor package 2, these electrodes are connected by the thin wires 6 of Au (gold) or Al (aluminum). The process is performed by using an apparatus called wire bonder.

Finally, the molding process will be described with reference to FIG. 14. After connecting the electrodes of the semiconductor chip 1 to the electrodes 5 of the semiconductor package 2 by the thin wires 6 of Au or Al, the semiconductor package 2 is molded with the lid 8 so that the concave portion 3 of the semiconductor package 2 is covered with the lid 8. The lid 8 is attached to the semiconductor package 2 by means of an adhesive.

The semiconductor packages for the semiconductor device which have conventionally been used can be roughly divided into the following two types.

The first type is ceramic packages. The ceramic packages can be subdivided into a lamination-type package and a glass-molding ceramic package.

The lamination-type ceramic package is formed as follows: first, minute holes are formed by mechanical processing in specified positions of green sheets, which are necessary for wiring. Those holes are filled with a conductive past. Next, a circuit is formed by the printing on each green sheet so that the green sheets with printed circuits are stacked one after the other. Subsequently, the stacked green sheets are subjected to baking, resulting in the main body of the package.

The glass-molding ceramic package is formed as follows: first, a low-melting-point glass is applied onto the top surface of the main body of the package as well as a lead frame is attached thereto. The lead frame is then bonded to the main body of the package by melting the low-melting-point glass in a heating furnace. After that, a Au paste or the like is applied to the central portion of the main frame of the package in which a semiconductor chip is to be mounted.

The second type is plastic packages, which are most commonly used. A package of this type is formed as follows: first, a semiconductor chip is mounted on a lead frame, and then an electrical connection is provided between the lead frame and semiconductor chip by a wire-bonding method. After that, a resin containing as its main component a thermo-curing curing resin, such as an epoxy resin, is injected into a mold, while the lead frame and semiconductor chip are held in the hollow portion of the mold, followed by curing, resulting in a plastic package.

With the ceramic and plastic packages, the electrical connection between the semiconductor chip and the package is mainly provided by a wire-bonding method using thin wires of Au or Al. However, the mounting technique using the wire-bonding method is disadvantageous in that the degree of miniaturization of the package is limited, for it requires a wiring area for connecting wires to be formed around the semiconductor chip which is mounted in the main portion of the package.

There has also been proposed a package formed by using a flip-flop mounting technique which was developed in order to mount a semiconductor chip directly on a circuit board. In a package formed by using the flip-flop mounting technique, a ceramic or a resin is used as the material for forming the substrate of the package.

The configuration which is characteristic of a conventional package formed by the flip-flop mounting technique is a cavity in which a semiconductor chip is to be mounted, similarly to the conventional ceramic package formed by the wire-bonding method. To protect the semiconductor chip mounted in the package, a lid composed of a metal, ceramic, or other material should therefore be attached to the package by using as a bonding material a low-melting-point glass or an Au-Sn alloy or by the method of resistance welding.

As the degree of miniaturization and performance of electronic equipment has been increasing, the main body of the semiconductor package described above is also required to be smaller and thinner, while its external electrodes are required to be greater. The semiconductor package described above is also provided with a heat sink for absorbing heat generated from the semiconductor chip.

Although the conventional semiconductor device shown in FIG. 11 is so constituted as to correspond to the miniaturization of the wiring layers of the semiconductor package 2, to the multiplied directions of the external terminals 7, and to the reduction of the spacing between the external terminals 7, the wire-bonding method is commonly used to provide an electrical connection between the semiconductor chip 1 and the semiconductor package 2 thereof. Hence, it is necessary in the semiconductor package 2 to surround the semiconductor chip 1 with an area having the width of 2.0 mm or more in which the electrodes 5 are to be formed so that the thin wires 6 are connected thereto. In addition, it is also necessary to surround the wire-bonding area 4 with an area having the width of 2.0 mm or more to which the lid 8 is to be attached.

Therefore, it is impossible to reduce the area of the semiconductor package 2 to the order of the area of the semiconductor chip 1, so that the requirements on the reduced size and thickness of the semiconductor package 2 cannot be fulfilled.

As for the method of mounting the semiconductor chip directly on the circuit board without holding the semiconductor chip in the semiconductor package, which has been proposed in order to densely mount the semiconductor chip on the circuit board, a heat sink should be provided so as to absorb heat generated from the semiconductor chip, with the result that a thinner semiconductor device cannot be realized, either.

SUMMARY OF THE INVENTION

An object of the present invention is to provide a smaller and thinner semiconductor device which overcomes all the foregoing disadvantages. In the semiconductor device according to the present invention, the area required for mounting a semiconductor chip is reduced and the reduction of the spacing between the external terminals of its semiconductor package is prevented. Moreover, the semiconductor device is provided with external electrodes which are excellent in mechanical strength and it can surely provide the normal operation without a heat sink.

A first semiconductor device according to the present invention comprises: an insulating substrate being provided with a plurality of electrodes for bump connection on its top surface and with external terminals arranged in an array on its undersurface; a semiconductor chip provided above said insulating substrate and having bump electrodes formed on its undersurface so that the bump electrodes are electrically connected to said electrodes for bump connection by means of a conductive adhesive; and a resin which fills the space between said semiconductor chip and said insulating substrate so as to integrate said semiconductor chip and said insulating substrate and which dissipates heat generated from said semiconductor chip.

The first semiconductor device does not require a wire-bonding area which has conventionally been necessary for connecting the semiconductor chip. Since the semiconductor chip is integrated with the insulating substrate by means of the resin which fills the space between the insulating substrate and semiconductor chip, the shearing stress is decreased by the foregoing resin and also the semiconductor chip is protected by the insulating substrate. Therefore, the attachment of a lid is no more necessary and the area of the package to which the lid is to be attached is no more necessary, either.

Since the entire undersurface of the insulating substrate is provided with the external terminals which are arranged in an array, a narrower pitch can be realized between the external electrodes, which facilitates the minimization of the semiconductor device. Moreover, since the external electrodes, which will serve as the electrodes of the circuit board, are provided on the undersurface of the insulating substrate, the area of the semiconductor device can be utilized efficiently.

Since the resin filling the space between the insulating substrate and semiconductor chip dissipates heat from the semiconductor chip to the outside, it is not necessary to provide a heat sink for absorbing heat generated from the semiconductor chip.

Thus, in the first semiconductor device, the entire bottom face of the package with a limited area can efficiently be utilized, because the electrode area around the semiconductor chip of the package, which has conventionally been necessary for wire bonding, and the area of the package to which the lid is to be attached are no more necessary. Moreover, since the provision of the heat sink is not necessary, either, a smaller and thinner semiconductor package can be provided while dense mounting of the semiconductor chip can be realized.

A method of manufacturing the first semiconductor device comprises the steps of: forming a plurality of electrodes for bump connection on the top surface of an insulating substrate and forming external terminals in an array on the undersurface of said insulating substrate, while forming a plurality of bump electrodes on one face of a semiconductor chip; supplying a conductive adhesive to said bump electrodes, then bonding said bump electrodes to said electrodes for bump connection, and subsequently curing said conductive adhesive; and injecting a heat-dissipating resin into the space between said semiconductor chip and said insulating substrate and then curing the resin so that said semiconductor chip is integrated with said insulating substrate.

To constitute a second semiconductor device, the first semiconductor device further comprises: a conductive layer formed on the top surface of said semiconductor chip; an electrode for back bias formed on the top surface of said insulating substrate; and a conductive film formed on the circumferential side face of said resin so as to electrically connect said conductive layer and said electrode for back bias.

With the second semiconductor device, the electrode for back bias on the insulating substrate can electrically be connected to the back face of the semiconductor chip. Hence, the second semiconductor device is advantageous in the case where the back face of a semiconductor chip such as a power IC transistor is used as an electrode and in the case where a negative voltage is produced in a semiconductor chip such as a random-access memory or microcomputer. Consequently, any semiconductor chip can be mounted on the insulating substrate by face-down bonding irrespective of the type of the semiconductor chip.

In the second semiconductor device, the angle formed between the circumferential side face of said resin and the top surface of said insulating substrate is preferably 60° or less and said conductive film is preferably composed of a conductive ink with which the circumferential side face of said resin is printed.

A method of manufacturing the second semiconductor device comprises the steps of: forming a plurality of electrodes for bump connection and an electrode for back bias on the top surface of an insulating substrate and forming external terminals in an array on the undersurface of said insulating substrate, while forming a plurality of bump electrodes on one face of a semiconductor chip and forming a conductive layer on the other face of said semiconductor chip; supplying a conductive adhesive to said bump electrodes, then bonding said bump electrodes to said electrodes for bump connection, and subsequently curing said conductive adhesive; injecting a heat-dissipating resin into the space between said semiconductor chip and said insulating substrate and then curing the resin so that said semiconductor chip is integrated with said insulating substrate; and forming a conductive film on the circumferential side face of said cured resin so that said electrode for back bias is electrically connected to said conductive layer.

In the methods of manufacturing the first and second semiconductor device, the step of injecting the heat-dissipating resin into the space between said semiconductor chip and said insulating substrate is preferably performed while applying supersonic waves to said insulating substrate.

Thus, the period of time required for injecting the resin into the space between the insulating substrate and semiconductor chip can be reduced, while eliminating bubbles which may result in voids in curing the resin.

In the first and second semiconductor device, the resin is preferably composed of an epoxy resin containing as a filler a ceramic with excellent thermal conductivity and a filler to be used is preferably aluminum nitride or silicon carbonate.

Thus, the ceramic with high thermal conductivity reduces the degree of thermal expansion of the resin, so that a stress induced in the semiconductor device can also be reduced. The ceramic also improves the thermal conductivity of the resin, so that the normal operation of the semiconductor device can be ensured even when heat is generated during the operation of the semiconductor device.

DETAILED DESCRIPTION OF THE PREFERRED EMBODIMENTS

Figure 1:
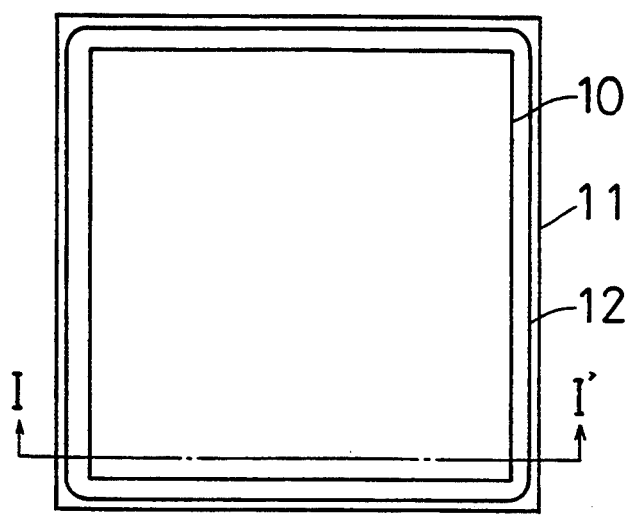
FIG. 1 is a plan view of a semiconductor device according to a first embodiment of the present invention.
Figure 2:
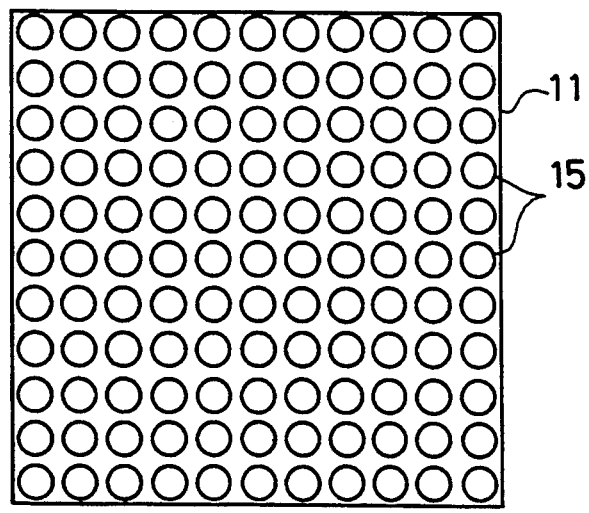
FIG. 2 is a bottom view of the semiconductor device according to the first embodiment of the present invention.
Figure 3:
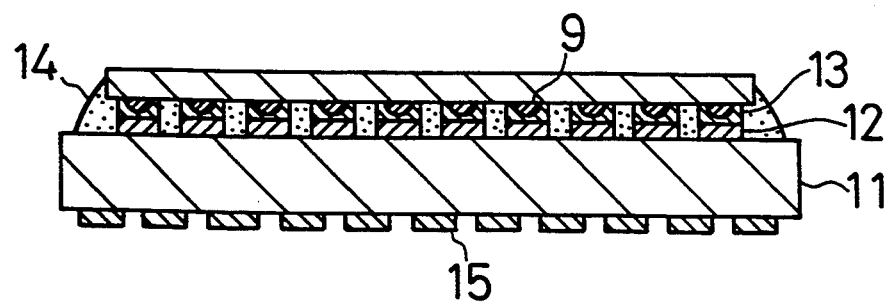
FIG. 3 is a cross section taken along the line I-I' of FIG. 1.

Referring now to FIGS. 1 to 3, a semiconductor device according to a first embodiment of the present invention will be described below.

As shown in FIGS. 1 to 3, in the semiconductor device according to the first embodiment, a semiconductor chip 10, on the surface electrode (not shown) of which bump electrodes 9 composed of Au are formed, is provided on an insulating substrate 11 composed of a ceramic serving as a multi-layer circuit board, so that its top surface faces downward.

On the top surface of the insulating substrate 11 are formed a plurality of electrodes 12 for bump connection, which are bonded to the bump electrodes 9 by means of a conductive adhesive 13.

The space between the semiconductor chip 10 and the insulating substrate 11 is filled with a resin 14, and the circumferential side face of the semiconductor chip 10 is also covered with the foregoing resin 14. The resin 14 is composed of an epoxy-type resin to which a ceramic with high thermal conductivity, such as aluminum nitride (AlN) or silicon carbonate (SIC), is added as a filler.

On the undersurface of the insulating substrate 11, serving as the multi-layer circuit board, are formed external terminals 15 composed of a Ag—Pd metallized layer which are regularly arranged in an array. Instead of Au—Pd, Cu or Au can be used for the metallized layer. The external terminals 15 are plated so that their surfaces are not oxidized. In the case where a solder is used to bond the bump electrode 9 and the electrode 12 for bump connection together, the metallized layer is preliminarily plated with Ni so as to prevent the metallized layer from dissolving in the solder. The pitch of the external terminals 15 which are composed of the metallized layer and formed in an array is about 0.8 mm. If the foregoing pitch exceeds 1.0 mm, the miniaturization of the semiconductor device cannot be realized. If the foregoing pitch is set at 0.6 mm or less, on the other contrary, high precision is required in mounting the insulating substrate 11 on the circuit board, and it becomes difficult to provide the bumps with a sufficient height, so that it becomes difficult to obtain stable connections because of the warping of the circuit board or for other reasons.

The first reason for using an epoxy-type resin in the resin 14 is that it prevents a thermal stress resulting from the difference in thermal stress between the semiconductor chip 10 and the insulating substrate 11 from being localized in the bump electrodes 9 and in the conductive adhesive 13. That is, by solidly fixing the semiconductor chip 10 to the insulating substrate 11 with the use of all epoxy-type resin which presents a high elastic modulus after being cured, a stress induced by the different amounts of deformation caused by a temperature change in the insulating substrate 11 and in the semiconductor chip 10 is changed into flexural deformation which is observed in a bimetallic phenomenon, thereby eliminating a shearing stress applied to the bump electrodes 9. The second reason for using an epoxy-type resin is that it permeates less water than a resin of other type such as a novolak-type resin.

If a ceramic with high thermal conductivity such as aluminum nitride (AlN) or silicon carbonate (SiC) is added as a filler, instead of commonly used silica (SiO$_2$), the thermal expansion coefficient and thermal conductivity of the resin 14 can be controlled, so that a temperature change due to the heat generated during the operation of the semiconductor device-can be prevented and hence the stress resultantly induced in the semiconductor device can be reduced.

Below, a semiconductor device according to a second embodiment of the present invention will be described with reference to FIG. 4.

Figure 4:
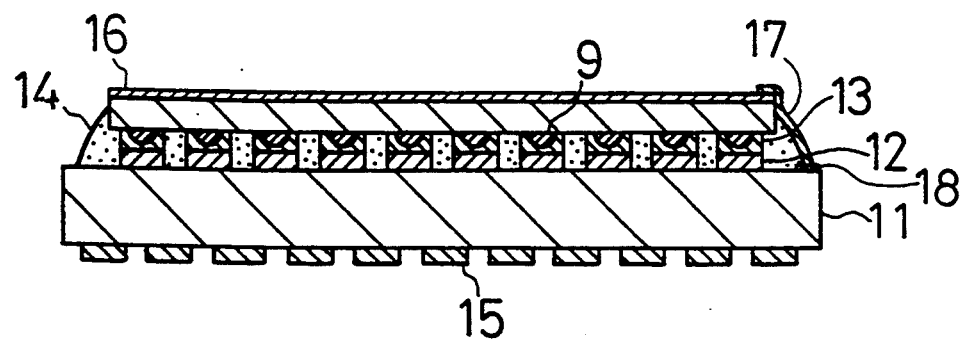
FIG. 4 is a cross section of a semiconductor device according to a second embodiment of the present invention.

As shown in FIG. 4, the fundamental structure of the semiconductor device is similar to that of the semiconductor device of the first embodiment except that an electrode 18 for back bias is formed on the top surface of the insulating substrate 11 at its edge, that a conductive layer 16 composed of, e.g., Au is formed on the back face (the top surface in FIG. 4) of the semiconductor chip 10, and that the conductive layer 16 and the electrode 18 for back bias are connected by a conductive film 17 with which the circumferential side face of the resin 14 is partly covered.

With the foregoing structure, a negative voltage is generated in the semiconductor chip 10, which enables so-called back bias whereby the generated negative voltage is connected to the electrodes of the insulating substrate 11 and the like.

Below, the process steps of the method of manufacturing the semiconductor device according to the first embodiment of the present invention will be described with reference to FIGS. 5 to 8.

Figure 5:
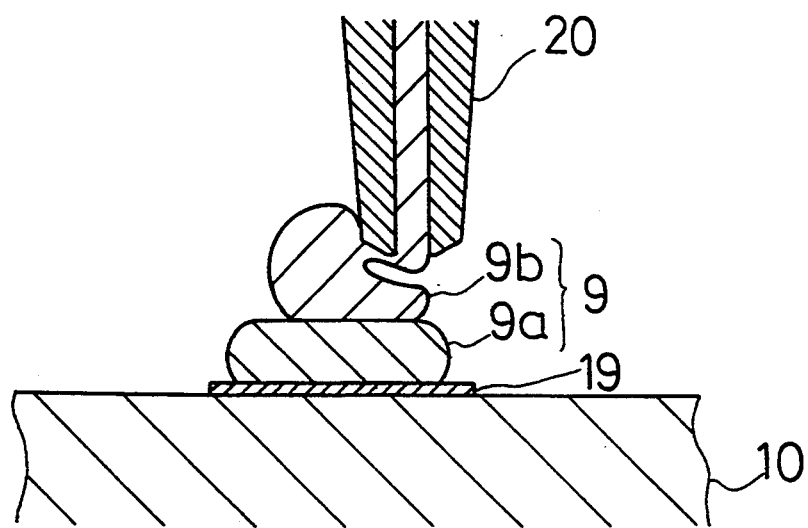
FIGS. 5 to 8 are cross sections of the semiconductor device according to the first embodiment of the present invention, which illustrate the process steps of its manufacturing method.

First, as shown in FIG. 5, the bump electrode 9 (2-stage Au electrode) is formed on the aluminum electrode 19 of the semiconductor chip 10 by using a wire-bonding method (ball-bonding method). According to the method, the ball formed on the tip of a Au wire is thermally compressed to the aluminum electrode 19, so as to form the lower-stage portion 9a of the bump electrode 9. Subsequently, the upper-stage portion 9b composed of a Au wire loop is formed on the lower-stage portion 9a by moving a capillary 20. However, the height of the Au 2-stage bump at this stage is not uniform, and its top surface is not completely flat, so that leveling is performed by pressing the Au 2-stage bump, resulting in the uniform height and flat top surface.

Next, the conductive adhesive 13 containing Ag—Pd as a conductive material is applied onto a rotating disk by using a doctor-blade method to a proper thickness, though the process is not shown in the drawings. In this case, the conductive adhesive 13 on the disk is agitated by a squeegee so as to keep its surface always new.

Figure 6:
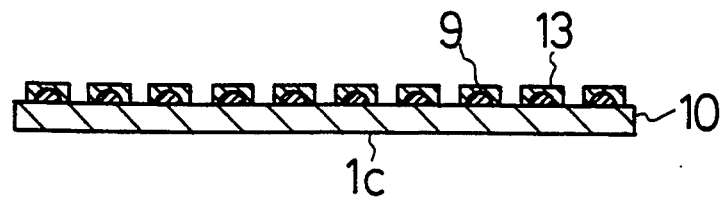

Next, as shown in FIG. 6, the conductive adhesive 13 is supplied to the bump electrodes 9 by a so-called transfer method in which the semiconductor chip 10 with the bump electrode 9 is pressed onto the conductive adhesive 13 and then lifted up. The conductive adhesive 13 contains, for example, an epoxy resin as the binder and Ag—Pd as a filler in consideration of its reliability and thermal stress.

Figure 7:
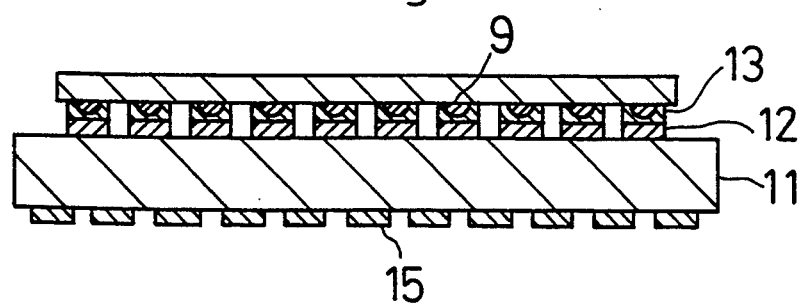

Next, as shown in FIG. 7, the bump electrodes 9 of the semiconductor chip 10, which have been provided with the conductive adhesive 13, are aligned with respect to the electrodes 12 for bump connection of the insulating substrate with high precision and then bonded thereto by a flip-chip method by which the semiconductor chip 10 is mounted on the insulating substrate 11 with its top surface facing downward. Subsequently, the conductive adhesive 13 is thermally cured at a specified temperature. When the conductive adhesive 13 contains an epoxy resin as the binder and a Ag—Pd alloy as a filler, the solvent is evaporated during one-hour standing at a temperature of 100° C. and then the binder is cured during subsequent two-hour standing at a temperature of 120° C., thereby completing the bonding of the bump electrodes 9 to the electrodes 12 for bump connection.

Figure 8:
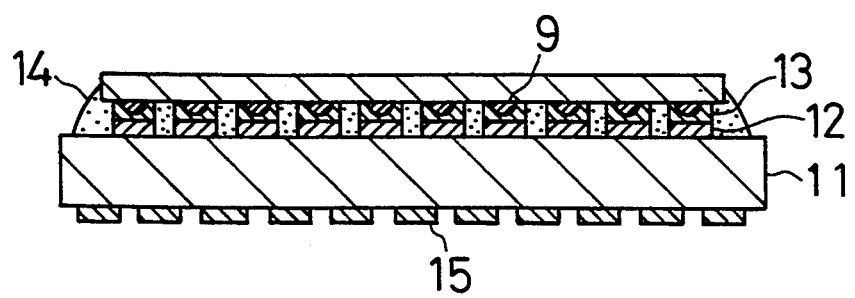

Next, as shown in FIG. 8, the space between the semiconductor chip 10 and the insulating substrate 11 is filled with a resin 14 as well as the circumferential end portion of the semiconductor chip 10 is covered with the resin 14. According to the resin-molding method, the resin 14 is injected in one direction into the space between the semiconductor chip 10 and the insulating substrate 11. After the space is filled up, the circumferential end portion of the semiconductor chip 10 is molded. The resin 14 used here is composed of an epoxy-type resin to which a ceramic with high thermal conductivity, such as aluminum nitride (AlN) or silicon carbonate (SIC), is added as a filler. When the resin 14 is supplied to the circumferential end portion of the semiconductor chip 10, it is ensured that the resin 14 substantially reaches the back face (the top surface in FIG. 8) of the semiconductor chip 10 and that the contact angle between the insulating substrate 11 and tile circumferential side face of the resin 14 is kept 60° or less. Subsequently, the resin 14 is cured by heating in an oven.

Next, to prevent the generation of voids in injecting the resin 14 into a narrow space, which has conventionally been known, and to reduce the period of time required for the injection, a supersonic wave vibrator is attached to a table to which the insulating substrate 11 is fixed so that supersonic waves are preferably applied to the table in the process of injecting the resin 14. In this manner, bubbles in the resin 14 which may result in voids when the resin 14 is cured can be eliminated by the application of the supersonic waves.

Below, the process step of the method of manufacturing the semiconductor device according to the second embodiment of the present invention will be described with reference to FIG. 9.

The steps before the molding of the resin 14 will not be described here, since they are in common with the method of manufacturing the semiconductor device according to the first embodiment.

In the method of manufacturing the semiconductor device according to the second embodiment, the conductive layer 16 is preliminarily formed on the back face of the semiconductor chip 10. After molding the resin 14, the conductive film 17 is formed.

Figure 9:
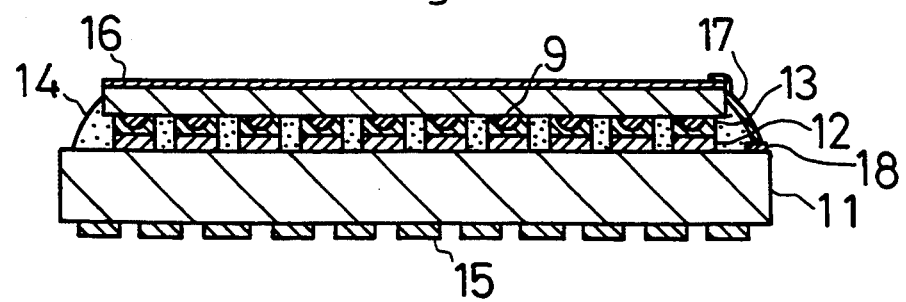
FIG. 9 is a cross section of the semiconductor device according to the second embodiment of the present invention, which illustrate the process step of its manufacturing method.

As shown in FIG. 9, an ultraviolet-curing ink with conductivity is applied by a dispenser or by offset printing selectively to the region extending from the edge portion of the back face (the top surface in FIG. 9) of the semiconductor chip 10 via the circumferential side face of the resin 14 to the electrode 18 for back bias on the insulating substrate 11, which is not covered with the resin 14. Subsequently, the ultraviolet-curing ink is cured so as to form the conductive film 17. In order to form the conductive film 17 by applying the ultraviolet-curing ink by offset printing, the contact angle between the insulating substrate 11 and the resin 14 is preferably 60° or less. The preferable range of the contact angle is determined as such, because, if the contact angle is more than 60°, the circumferential side face of the resin is not completely coated with the ultraviolet-curing ink.

Below, the method of manufacturing the insulating substrate 11 will be described.

First, a ceramic powder, glass powder, and solvent are charged into a mixing mill so that they are grounded and mixed by rotations. Next, an organic binder is added to the mixture, followed by further mixing. The ceramic powder normally contains alumina as its main component, but aluminum nitride (AlN) or silicon carbonate (SiC) may be added thereto for the purpose of particularly improving thermal conductivity. The resultant slurry, which was obtained by sufficient mixing, is applied onto a carrier sheet to a specified thickness so as to form a green sheet. The thickness is adjusted by a doctor-blade or like method. After the slurry on the carrier sheet is dried by evaporating the solvent with an infrared ray and with a blast of hot air, a green sheet which is highly elastic and excellent at permeating a paste solvent in the printing using a conductive paste is obtained.

To align green sheets, guiding holes are formed directly in the green sheets in the case where the design rule is 200 μm or more, while the green sheets are attached to a holder formed with guiding holes in the case where the design rule is less than 200 μm.

Next, holes are formed by mechanical processing in the portion which requires the electrical connection between the top surface and undersurface of the green sheet. The conducting paste containing a Cu powder as its main component is filled in the holes by a printing method.

After printing a necessary circuit on the surface of the green sheet, it is dried so that the printed circuit is buried into the green sheet by the application of an appropriate load thereafter. This process is for preventing delamination in the following laminating step by leveling the surface of the green sheet on which a circuit is printed. In the laminating step, the green sheets are stacked with high precision in accordance with the guiding holes provided in the green sheets or with the guiding holes of the holder. After that, a pressure is applied to the stacked green sheets, thereby obtaining the insulating substrate 11 composed of a ceramic.

An eutectic solder paste composed of Sn—Pb is applied to the electrodes formed in an array on the undersurface of the insulating substrate 11 thus obtained. Thereafter, a solder ball with high melting point is supplied to the applied solder paste by means of an aligning instrument. Next, the external terminals 15 are formed by heating and melting with the u,se of a reflow furnace or the like, thereby completing the manufacturing of the insulating substrate 11.

Figure 10:
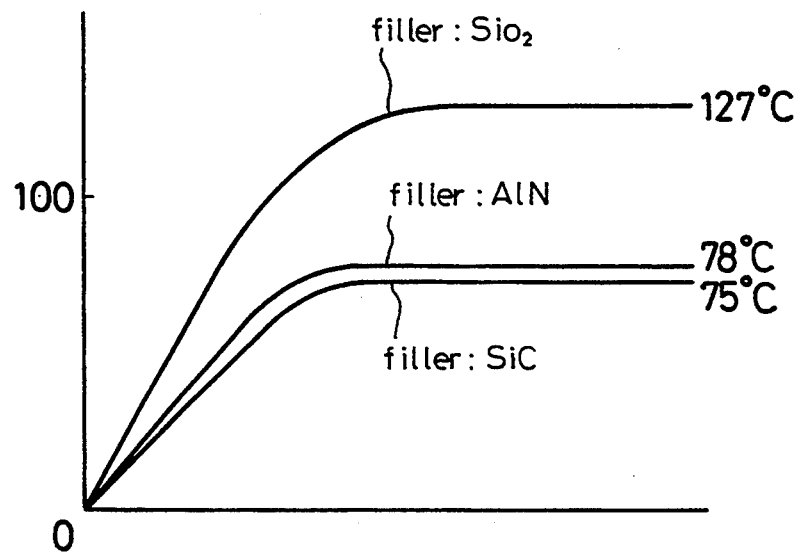
FIG. 10 is a characteristic view showing the increases in temperature which are caused during the operation of the semiconductor device according to the first and second embodiments.
Figure 11:
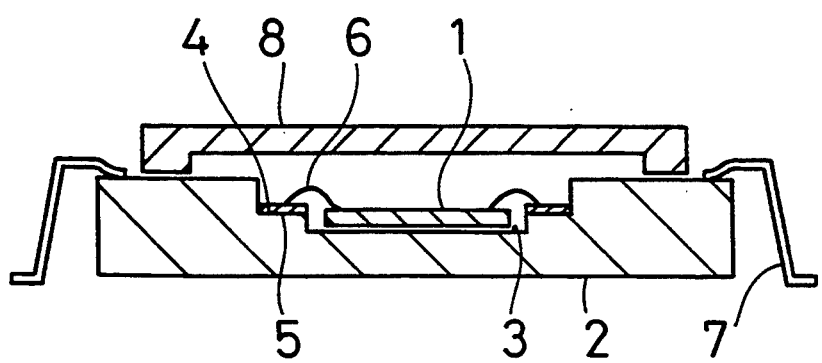
FIG. 11 is a cross section of a conventional semiconductor device.
Figure 12:
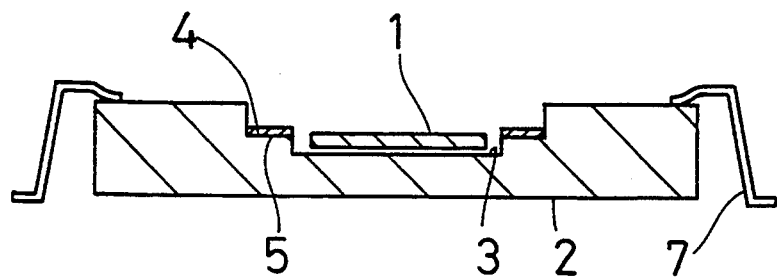
FIGS. 12 to 14 are cross sections of the conventional semiconductor device, which illustrate the process steps of its manufacturing method.
Figure 13:
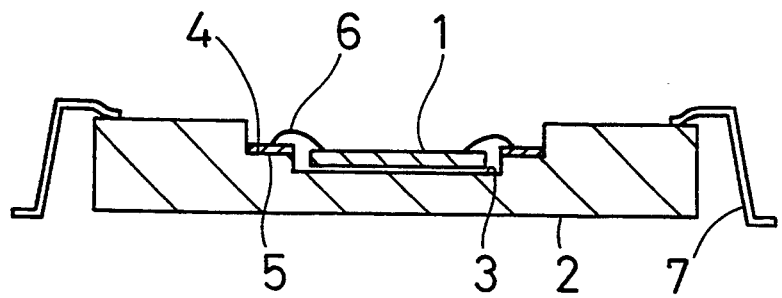
Figure 14:
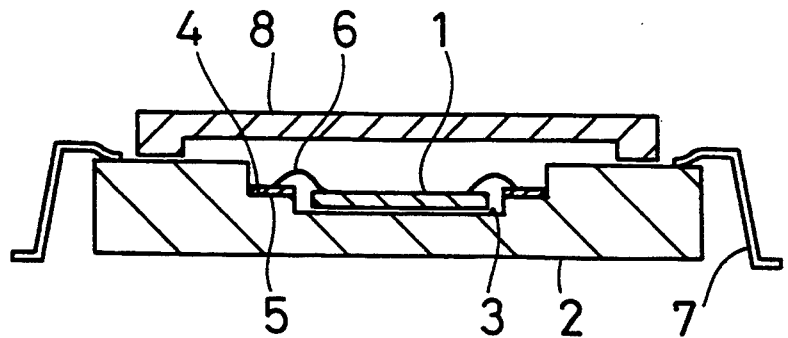

FIG. 10 is a view showing for comparison the increases in temperature of the semiconductor chips which are provided in different semiconductor device. The characteristic curves in FIG. 10 were obtained by operating the semiconductor device using different resins with the power of 1 W (5 V×0.2 A), so that their semiconductor chips generated heat. The resins molded in the semiconductor device are: a resin composed of an epoxy-type resin with silica ($SiO_2$) added thereto as a filler; a resin composed of an epoxy-type resin with aluminum nitride (AlN), which is a ceramic with high thermal conductivity, added thereto as a filler; and a resin composed of an epoxy-type resin with silicon nitride (SiC) added thereto as a filler. Each of silica, aluminum nitride, and silicon carbonate added as a filler has the particle diameter of 5 μm, and each of them was added in the amount of 40 wt %. The temperature was increased by driving each of the semiconductor device until it reached a specified value. After the temperature became constant, it was measured at a room temperature of 25° C. without a blast of air.

As can be seen from FIG. 10, the temperature in the semiconductor device was increased to about 80° C. when aluminum nitride was added as a filler, but it did not reach or surpass 100° C. Consequently, the semiconductor device was free from mis-operation and breakdown and the peripheral system was not adversely affected by heat, either. When silica was added as a filler, on the other hand, the temperature reached about 130° C., so that, without a heat sink, the mis-operation or breakdown of the semiconductor device may be caused. When silicon carbonate or the like was added as a filler, instead of aluminum nitride, the similar effects were obtained.

When the particle diameter of a filler to be added is increased to 10 μm and its amount to be added is increased to 70 wt %, its thermal conductivity is increased but the mobility of the resin 14 while being injected is decreased. Hence, the preferable particle diameter of a filler is about 5 μm and the preferable amount of a filler is about 40 wt %.

We claim:

1. A semiconductor device comprising:
   an insulating substrate provided with a plurality of electrodes for bump connection on its top surface and with external terminals arranged in an array on its undersurface;
   a semiconductor chip provided above said insulating substrate and having bump electrodes formed on its undersurface so that the bump electrodes are electrically connected to said electrodes for bump connection by means of a conductive adhesive;
   a resin which fills the space between said semiconductor chip and said insulating substrate so as to integrate said semiconductor chip and said insulating substrate, said resin dissipating heat generated from said semiconductor chip;
   a conductive layer formed on the top surface of said semiconductor chip;
   an electrode for back bias formed on the top surface of said insulating substrate; and
   a conductive film formed on the circumferential side face of said resin so as to electrically connect said conductive layer and said electrode for back bias.

2. A semiconductor device according to claim 1, wherein the angle formed between the circumferential side face of said resin and the top surface of said insulating substrate is 60° or less and said conductive film is composed of a conductive ink with which the circumferential side face of said resin is printed.

* * * * *